(12) United States Patent
Chang et al.

(10) Patent No.: US 10,539,878 B2
(45) Date of Patent: Jan. 21, 2020

(54) LITHOGRAPHY PATTERNING TECHNIQUE

(71) Applicant: Taiwan Semiconductor Manufacturing Company, Ltd., Hsin-Chu (TW)

(72) Inventors: Lilin Chang, Taipei (TW); Ching-Yu Chang, Yilang County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 97 days.

(21) Appl. No.: 15/588,773

(22) Filed: May 8, 2017

(65) Prior Publication Data

US 2017/0242341 A1    Aug. 24, 2017

Related U.S. Application Data

(62) Division of application No. 14/529,944, filed on Oct. 31, 2014, now Pat. No. 9,645,497.

(51) Int. Cl.
*G03F 7/32* (2006.01)
*G03F 7/20* (2006.01)

(52) U.S. Cl.
CPC ............... *G03F 7/322* (2013.01); *G03F 7/20* (2013.01)

(58) Field of Classification Search
CPC ........................................................ G03F 7/32
See application file for complete search history.

(56) References Cited

U.S. PATENT DOCUMENTS

| 6,372,415 | B1 | 4/2002 | Nomoto et al. |
| 8,512,939 | B2 | 8/2013 | Wang et al. |
| 8,841,066 | B2 | 9/2014 | Wang et al. |
| 2013/0288180 | A1 | 10/2013 | Hatakeyama et al. |
| 2016/0124310 | A1 | 5/2016 | Chang et al. |

*Primary Examiner* — Kathleen Duda
(74) *Attorney, Agent, or Firm* — Haynes and Boone, LLP

(57) ABSTRACT

A lithography developing composition is disclosed. In an exemplary aspect, the composition comprises an alkaline aqueous solution having a first organic base and a second organic base, wherein the first organic base is a quaternary ammonium hydroxide with pendant groups on its side chains and the second organic base is another quaternary ammonium hydroxide with electron withdrawing groups on its side chains. In another exemplary aspect, the composition comprises an alkaline aqueous solution having an organic base that is a quaternary ammonium hydroxide with at least one electron withdrawing group on its side chains and the organic base has basicity weaker than Tetramethylammonium hydroxide (TMAH). In yet another exemplary aspect, the composition comprises an alkaline aqueous solution having an organic base that is Trimethylphenylammonium hydroxide or Benzyldimethyltetradecylammonium hydroxide.

20 Claims, 4 Drawing Sheets

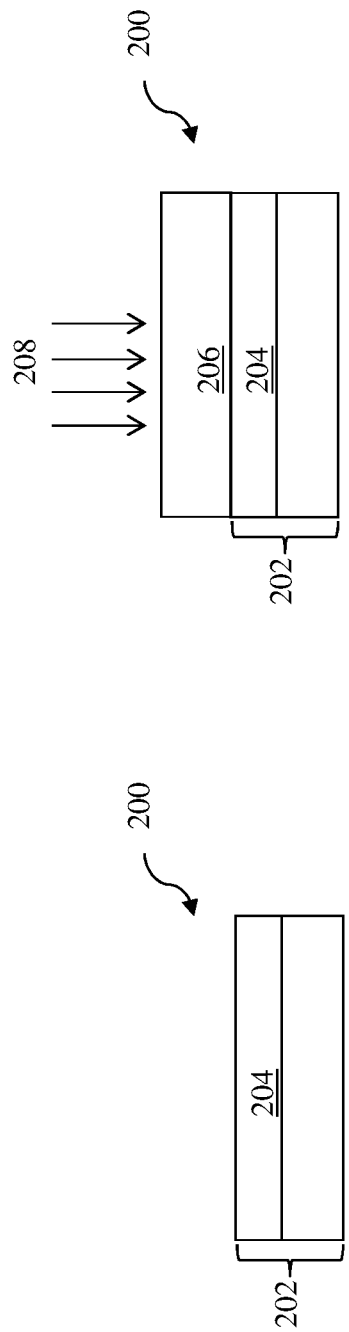

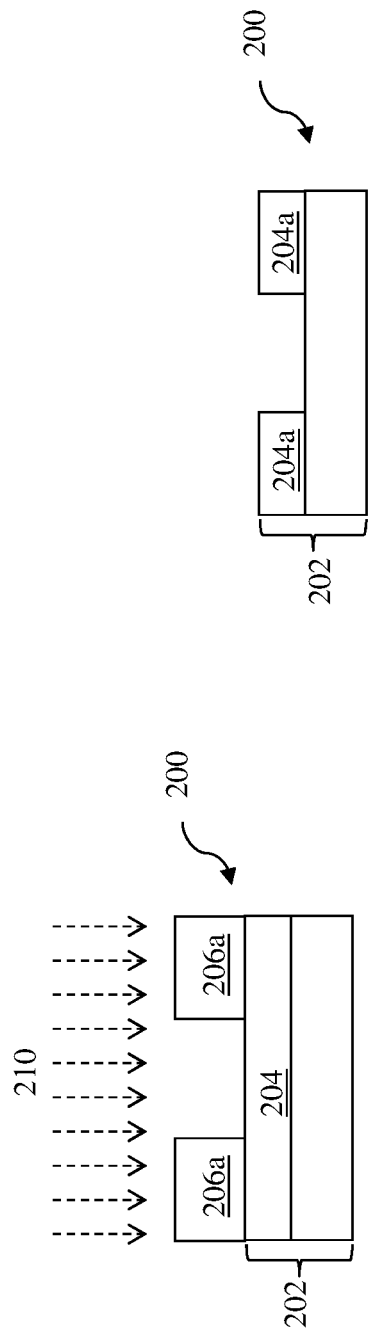

LITHOGRAPHY PATTERNING TECHNIQUE

PRIORITY

This is a divisional of U.S. patent application Ser. No. 14/529,944, filed Oct. 31, 2014, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, lithography has been the traditional method for transferring IC patterns to semiconductor wafers. In a typical lithography process, a resist film is coated on a surface of a wafer and is subsequently exposed and developed to form a resist pattern. The resist pattern is then used for etching the wafer to form an IC. The quality of the resist pattern directly impacts the quality of the final IC. As the scaling down process continues, line edge roughness (LER) and line width roughness (LWR) of the resist pattern have become more critical. Multiple factors affect the LER/LWR of a resist pattern, among which is the chemical solution used for developing the exposed resist film.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, and 2D illustrate cross sectional views of forming a target pattern according to the method of FIG. 1, in accordance with an embodiment.

DETAILED DESCRIPTION

Figure 1:
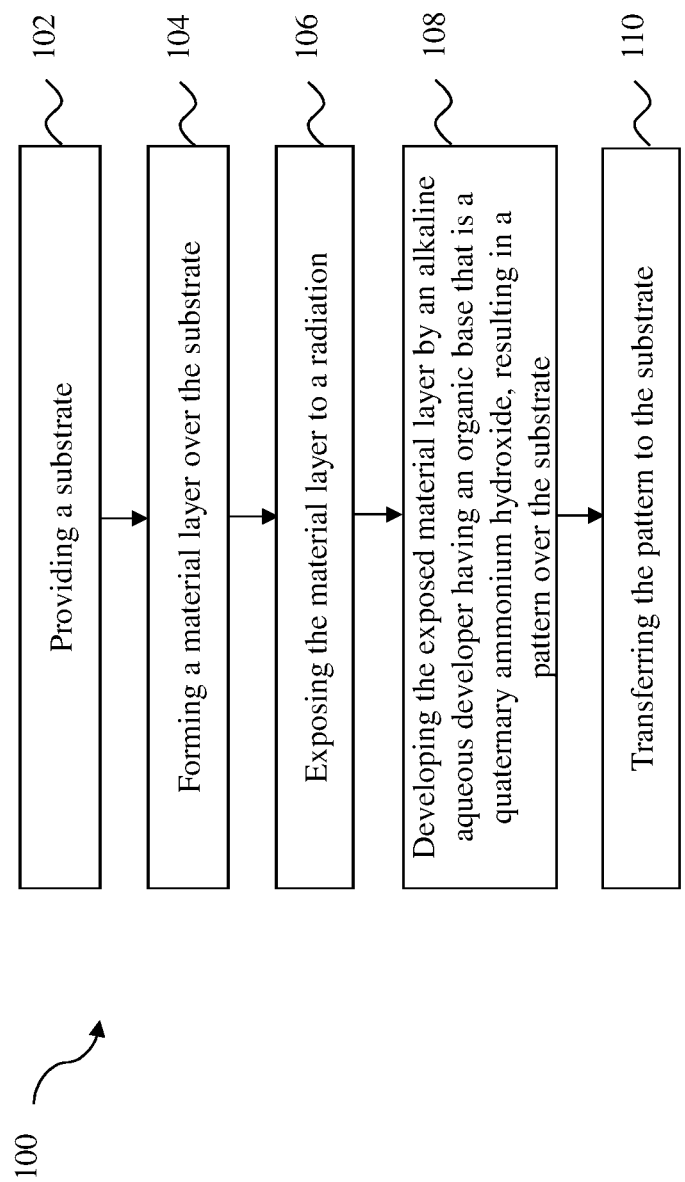
FIG. 1 illustrates a flow chart of a lithography patterning method according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to methods of lithography patterning. In lithography patterning, after a resist film is exposed, it is developed in a developer (a chemical solution). The developer removes portions of the resist film, thereby forming a resist pattern which may include line patterns and/or trench patterns. The resist pattern is used as an etch mask in subsequent etching processes, transferring the pattern to underlying patterning layers. The lines and/or trenches of a resist pattern usually have non-uniform side wall dimensions (e.g., LER or LWR) due to various factors, some of which are related to the properties of the developer. For example, the developer may penetrate the resist film with varying depth at different areas of the resist film. Some developer molecules may even stay inside the resist patterns after the developing process and cause portions of the resist patterns to swell. Such dimension non-uniformity in a resist pattern may contribute to degradation of IC performance and should be avoided whenever possible. This is particularly true in nanometer (nm) fabrication regimes. The present disclosure provides methods and compositions for developing resist films so as to improve dimension uniformity of resist patterns.

FIG. 1 is a flow chart of a method 100 of patterning a substrate (e.g., a semiconductor wafer) according to various aspects of the present disclosure. The method 100 may be implemented, in whole or in part, by a system employing deep ultraviolet (DUV) lithography, extreme ultraviolet (EUV) lithography, electron beam (e-beam) lithography, x-ray lithography, and other lithography processes to improve pattern dimension accuracy. Additional operations can be provided before, during, and after the method 100, and some operations described can be replaced, eliminated, or moved around for additional embodiments of the method. The method 100 is an example, and is not intended to limit the present disclosure beyond what is explicitly recited in the claims. The method 100 is described below in conjunction with FIGS. 2A-2D wherein a semiconductor device 200 is fabricated by using embodiments of the method 100. The semiconductor device 200 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

The method 100 (FIG. 1) is provided with a substrate 202 (FIG. 2A) at operation 102. Referring to FIG. 2A, the substrate 202 includes one or more layers of material or composition. In an embodiment, the substrate 202 is a semiconductor substrate (e.g., wafer). In another embodiment, the substrate 202 includes silicon in a crystalline structure. In alternative embodiments, the substrate 202 includes other elementary semiconductors such as germanium, or a compound semiconductor such as silicon carbide, gallium arsenide, indium arsenide, and indium phosphide. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers. In the present embodiment, the substrate 202 includes a patterning layer 204. In an embodiment, the patterning layer 204 is a hard mask layer including material(s) such as amorphous silicon (a-Si), silicon oxide, silicon nitride (SiN), titanium nitride, or other suitable material or composition. In an embodiment, the patterning layer 204 is an anti-reflection coating (ARC) layer such as a nitrogen-free anti-reflection coating (NFARC) layer including material(s) such as silicon oxide, silicon oxygen carbide, or plasma enhanced chemical vapor deposited silicon oxide. In various embodiments, the patterning layer 204 may include a high-k dielectric layer, a gate layer, a hard mask layer, an interfacial layer, a capping layer, a diffusion/barrier layer, a dielectric layer, a conductive layer, other suitable layers, and/or combinations thereof. In another embodiment, the substrate 202 is a mask substrate that may include a low thermal expansion material such as quartz, silicon, silicon carbide, or silicon oxide-titanium oxide compound. To further this example, the substrate 202 may be a mask substrate for making a deep ultraviolet (DUV) mask, an extreme ultraviolet (EUV) mask, or other types of masks.

The method 100 (FIG. 1) proceeds to operations 104 by forming a material layer 206 over the substrate 202 (FIG. 2B). Referring to FIG. 2B, in an embodiment, the material layer 206 is formed by spin-on coating a liquid polymeric material onto the substrate 202, followed by a soft baking process and a hard baking process. In an embodiment, the material layer 206 is a radiation sensitive layer, such as a photoresist including an I-line resist, a DUV resist including a krypton fluoride (KrF) resist and argon fluoride (ArF) resist, a EUV resist, an electron beam (e-beam) resist, and an ion beam resist. For the sake of convenience, the material layer 206 is simply referred to as the resist 206 in the following discussion. In various embodiments, the resist 206 contains both acid labile groups (ALGs) and non-ALGs. Exemplary non-ALGs include lactone, alcohol, ketone, and some polar units. One material suitable for the resist 206 is a chemically amplified resist (CAR) that contains backbone polymer protected by ALGs. The CAR further contains photo-acid generators (PAGs) which, upon radiation, produce an acid. The acid can catalyze the cleaving of the ALGs from the backbone polymer, though often requiring that the resist-coated substrate 202 be heated (such as in a post exposure baking (PEB) process). This cleaving reaction is catalytic, in the sense that the acid still remains after the reaction, and is therefore available to promote the cleaving of additional ALGs. Such a cleaving reaction will be terminated only when the acid produced comes in contact with a base, also referred to as a base quencher. When the ALGs leave the backbone polymer, the branch unit of the polymer will be changed to carboxylic group that increases the polymer's solubility to a positive tone developer; thus, allowing the irradiated area of the resist to be removed by the developer, while the non-irradiated area remains insoluble and becomes a masking element for subsequent processes. This type of resist is referred to as a positive resist. Another type of resist, a negative resist, has the opposite behavior: it is generally soluble in a developer, but becomes insoluble upon radiation. In the present embodiment, the resist 206 is a positive resist.

The method 100 (FIG. 1) proceeds to operation 106 by exposing the resist 206 to a radiation 208 in a lithography system. Referring to FIG. 2B, the radiation 208 may be an I-line (365 nm), a DUV radiation such as KrF excimer laser (248 nm) or ArF excimer laser (193 nm), a EUV radiation (e.g., 13.8 nm), an e-beam, an x-ray, an ion beam, or other suitable radiations. Operation 106 may be performed in air, in a liquid (immersion lithography), or in a vacuum (e.g., for EUV lithography and e-beam lithography). In an embodiment, the radiation 208 is patterned with a mask, such as a transmissive mask or a reflective mask, which may include resolution enhancement techniques such as phase-shifting and/or optical proximity correction (OPC). In another embodiment, the radiation 208 is directly modulated with a predefined pattern, such as an IC layout, without using a mask (maskless lithography). In the present embodiment, the radiation 208 exposes portions of the resist 206 according to a pattern, either with a mask or maskless. The irradiated portions of the resist 206 become soluble in a developer. Additionally, the semiconductor device 200 may be subjected to one or more post-exposure baking processes, which accelerate the cleaving of the ALGs as discussed above.

The method 100 (FIG. 1) proceeds to operation 108 by developing the exposed resist 206 in a developer 210, constructed according to various aspects of the present disclosure. Portions of the resist 206 are removed by the developer 210, resulting a resist pattern 206a (FIG. 2C). In the example as shown in FIG. 2C, the resist pattern 206a are represented by two line patterns. However, the following discussion is equally applicable to resist patterns represented by trenches.

Figure 3B:
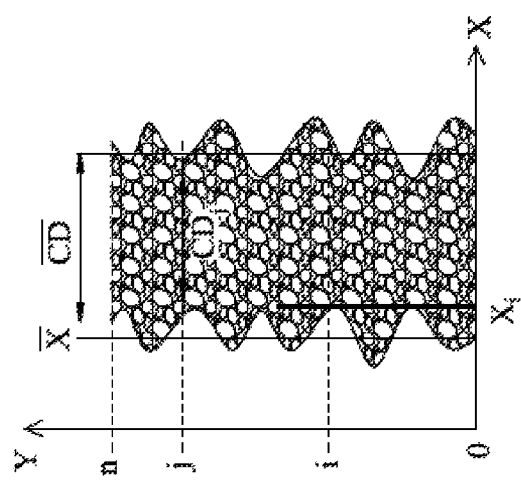
FIGS. 3A and 3B illustrate edge roughness, width roughness, and critical dimension of a resist pattern.
Figure 3A:
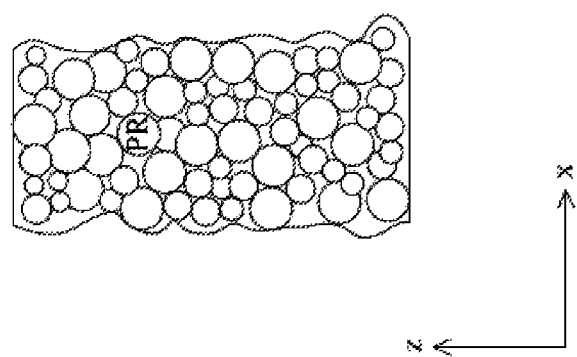

As discussed above, the quality of the resist pattern 206a directly impacts the quality of the final fabricated product(s). Among various measures of the quality of the resist pattern 206a are the surface uniformity of its sidewalls. Such uniformity is usually given in terms of line edge roughness (LER) and/or line width roughness (LWR). FIG. 3A illustrates a cross-sectional view of a line pattern, showing roughness of its sidewalls. FIG. 3B illustrates surface roughness along the line pattern in the "y" direction (or its length direction). In the present embodiment, LER is defined as a 3σ deviation of an edge from a line fit to that edge, or mathematically, $$LER = 3\sqrt{\sum_{i=0}^{n}(x_i - \bar{x})^2/n} \sqrt{\sum_{i=0}^{n}(x_i - \bar{x})^2/n} \ ;$$

and LWR is defined as a 3σ deviation of the line width, CD, along the line, or mathematically, $$LWR = 3\sqrt{\sum_{j=0}^{n}(CD_j - \overline{CD})^2/n} \ .$$

Such non-ideal CD and undesirable LER/LWR may be transferred from the line pattern to a substrate, causing IC fabrication issues. For example, the line pattern may be used to pattern a transistor gate electrode whose gate length corresponds to the width of the line pattern. Gate length is a critical feature of a transistor because it may affect power consumption and/or switching speed of the transistor. Undesirable LER/LWR can cause the gate length to be out of design specification.

The Applicants have identified some properties of traditional developers that might have caused excessive LER and LWR in existing resist development processes, which will be explained below. In some respects, resist development can be analogized as individual developer molecules etching (dissolving) the resist material surrounding them. Developers with stronger basicity exhibit larger etching distance, i.e. more resist material being dissolved by each developer molecule. This, combined with random molecular penetration depth inside the resist surface, creates uneven resist sidewalls. Some developers have greater penetration strength, creating more randomness in the etching depth. Some developer molecules even stay inside the resist pattern after the development and subsequently cause swelling of the resist pattern. All of these phenomena lead to excessive LER and LWR in the developed resist patterns.

The present disclosure addresses the above problems with innovative developer solutions. Lab experiments have shown that the resist pattern 206a developed with embodiments of the present disclosure shows reduced LER and LWR compared with resist patterns developed with traditional developers. This is very desirable for advanced process nodes, such as 10 nanometer (nm) and beyond.

In an embodiment, the developer 210 is an alkaline aqueous solution having an organic base that is a quaternary ammonium hydroxide. In an embodiment, the quaternary amine has one or more bulky groups in its side chains. The one or more bulky groups have steric functions that reduce the developer 210's penetration strength. This provides one or more benefits for the developing of the resist pattern 206a. For example, the molecules of the organic base in the developer 210 tend to stay close to the surface of the resist 206, reducing etching depth randomness. The number of developer molecules inside the developed resist pattern 206a is also reduced, reducing the swelling thereof. The net effect is that, with the developer 210, the resist pattern 206a attains smoother sidewalls.

In an embodiment, the organic base in the developer 210 is represented by the formula (Formula (1)):

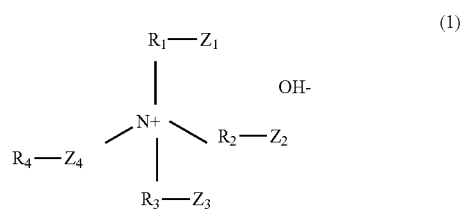

(1)

wherein $R_1$—$Z_1$, $R_2$—$Z_2$, $R_3$—$Z_3$, and $R_4$—$Z_4$ are steric functional groups.

In various embodiments, $R_1$, $R_2$, $R_3$, and/or $R_4$ include an unbranched group, a branched group, a cyclic group, a noncyclic group, a saturated group, an unsaturated group, an alkyl chain, or an aromatic ring. Furthermore, $R_1$, $R_2$, $R_3$, and/or $R_4$ may have a chain carbon number between about 1 and about 15. In the present example, at least one of $R_1$—$Z_1$, $R_2$—$Z_2$, $R_3$—$Z_3$, and $R_4$—$Z_4$ has a van der Waals volume larger than an ethylene group. In an embodiment, at least one of $R_1$, $R_2$, $R_3$, and $R_4$ has a formula $(R_5O)_nH$ wherein $R_5$ is an alkylene of 1 to 3 carbons and n is an integer ranging from 1 to 20.

$Z_1$, $Z_2$, $Z_3$, and/or $Z_4$ comprise a pendant group. The pendant group may be selected from the group consisting of —H, —Cl, —Br, —I, —NO$_2$, —SO$_3$—, —H—, —CN, —NCO, —OCN, —CO$_2$—, —OH, —OR*, —OC(O)CR*, —SR, —SO$_2$N(R*)$_2$, —SO$_2$R*, SOR, —C(O)R*, —C(O)OR*, —Si(OR*)$_3$, —Si(R*)$_3$, and an epoxyl group. In the above formulae, R* includes at least one of hydrogen, an unbranched group, a branched group, a cyclic group, a noncyclic group, a saturated group, an unsaturated group, an alkyl group, an alkenyl group, and an alkynyl group.

In one example, the organic base of the developer 210 is Tetrabutylammonium hydroxide (TBAH). In another example, the organic base of the developer 210 is Tetrapropylammonium hydroxide (TPAH).

In another embodiment, the developer 210 is an alkaline aqueous solution with low alkaline concentration (or loading). As discussed above, the stronger basicity of a developer, the greater etching distance of its molecules. Therefore, reducing basicity of a developer will lead to smaller LER and LWR of a developed resist pattern. In an embodiment, the developer 210 is an alkaline aqueous solution with an alkaline concentration in the range of about 0.01% to about 2%, such as from about 0.5% to about 2%. In an embodiment, the developer 210 includes a first concentration of an organic base that is a quaternary ammonium hydroxide wherein the first concentration is in the range of about 0.01% to about 2.37%, such as from about 0.5% to about 2%, and the quaternary ammonium hydroxide has one or more bulky groups in its side chains as discussed above. In this embodiment, the developer 210 has the combined property of low penetration strength and low basicity, and therefore can be used for producing resist patterns with low LER and LWR. In one example of such an embodiment, the concentration of the organic base in the developer 210 is less than 1.5%.

In yet another embodiment, the developer 210 is an alkaline aqueous solution having an organic base that is a quaternary ammonium hydroxide with weak basicity. In one example, the quaternary ammonium hydroxide has basicity weaker than Tetramethylammonium hydroxide (TMAH). In another example, the pka of the quaternary ammonium hydroxide is less than 9.8. In an embodiment, this quaternary ammonium hydroxide can be represented by the following formula (Formula (2)):

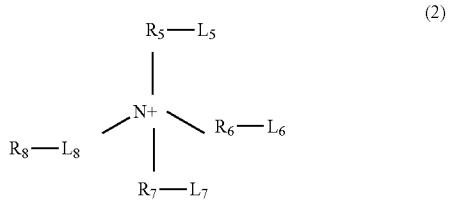

(2)

$R_5$, $R_6$, $R_7$, and $R_8$ are each selected from a group consisting of a single bond, an unbranched group, a branched group, a cyclic group, a noncyclic group, a saturated group, an unsaturated group, an alkyl chain, and an aromatic ring.

$L_5$, $L_6$, $L_7$, and/or $L_8$ comprise an electron withdrawing group that decreases the basicity of the quaternary ammonium hydroxide. The electron withdrawing group may be selected from the group consisting of —F, —Cl, —Br, —I, —BF$_3$, —CF$_3$, —CN, C=O, C≡C, CHO, NO$_2$, —COR, COOR, COOH, CONHR, BR$_2$, SO$_3$R, —NHCOR, -phenyl, -pyridine, —SOR, -alkyl, —SO$_2$F, diketone, naphthalene, diphenyl, fluorine, and indene.

In an embodiment, the developer 210 is an alkaline aqueous solution that includes a first organic base and a second organic base, wherein the first organic base is represented by Formula (1) above and the second organic base is represented by Formula (2) above. The developer 210 may further have a low organic base concentration in the range of about 0.01% to about 2%.

In yet another embodiment, the developer 210 is an alkaline aqueous solution that includes an organic base having properties equivalent to the ones represented by both Formula (1) and Formula (2). In one example, the organic base is represented by the following formula (Formula (3)):

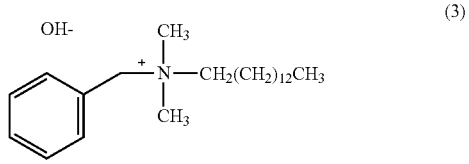

(3)

One chemical represented by Formula (3) is Benzyldimethyltetradecylammonium hydroxide. In another example, the organic base is represented by the following formula (Formula (4)):

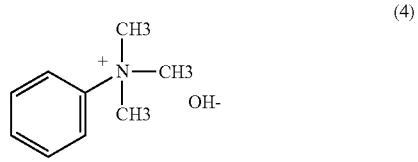

(4)

One chemical represented by Formula (4) is Trimethylphenylammonium hydroxide. In this embodiment, the developer 210 may further have a low organic base concentration in the range of about 0.01% to about 2%, such as from about 0.5% to about 1.5%. The developer 210 thus has the combined property of low penetration strength, low basicity, and low loading effect. It therefore can be used to develop the resist pattern 206a with extremely low LER and LWR, ideal for nanometer IC fabrication.

In various embodiments discussed above, the developer 210 may further include a surfactant. The surfactant improves the developer 210's wettability to the bottom of trench patterns, reduces its capillary force, and reduces bubbling during resist development.

Still referring to FIG. 2C, the developer 210, constructed according to various aspects of the present disclosure, is applied to the resist 206. The exposed portions of the resist 206 are dissolved by the developer 210, leaving the unexposed portion 206a as the resist pattern over the substrate 202. Due to the properties of the developer 210 discussed above, the resist pattern 206a has very low LER and LWR. In various embodiments, the developer 210 can be continuously sprayed onto the semiconductor device 200, or can be applied by other means such as a puddle process. The method 100 may include further operations to finalize the resist pattern 206a after operation 108. For example, the semiconductor device 200 may be subjected to a rinsing operation using de-ionized (DI) water to remove residues and particles, and/or a post-development baking (PDB) process to harden the resist pattern 206a so as to increase its structural stability.

The method 100 (FIG. 1) proceeds to operation 110 to etch the substrate 202 using the resist pattern 206a as an etch mask, thereby transferring the pattern from the resist pattern 206a to the substrate 202 (FIG. 2D). In an embodiment, the patterning layer 204 is a hard mask layer. To further this embodiment, the pattern is first transferred from the resist pattern 206 a to the hard mask layer 204, then to other layers of the substrate 202. For example, the hard mask layer 204 may be etched through openings of the resist pattern 206a using a dry (plasma) etching, a wet etching, and/or other etching methods. For example, a dry etching process may implement an oxygen-containing gas, a fluorine-containing gas (e.g., CF$_4$, SF$_6$, CH$_2$F$_2$, CHF$_3$, and/or C$_2$F$_6$), a chlorine-containing gas (e.g., Cl$_2$, CHCl$_3$, CCl$_4$, and/or BCl$_3$), a bromine-containing gas (e.g., HBr and/or CHBR$_3$), an iodine-containing gas, other suitable gases and/or plasmas, and/or combinations thereof. The resist pattern 206a may be partially or completely consumed during the etching of the hard mask layer 204. In an embodiment, any remaining portion of the resist pattern 206a may be stripped off, leaving a patterned hard mask layer 204a over the substrate 202, as illustrated in FIG. 2D.

Although not shown in FIG. 1, the method 100 may proceed to forming a final pattern or an IC device on the substrate 202. In an embodiment, the substrate 202 is a semiconductor substrate and the method 100 proceeds to forming fin field effect transistor (FinFET) structures. In this embodiment, operation 110 forms a plurality of active fins in the semiconductor substrate 202. The active fins have uniform CD, thanks to the extreme low LER and LWR of the resist pattern 206 a. In another embodiment, the method 100 proceeds to forming a plurality of gate electrodes in the semiconductor substrate 202. The gate electrodes have uniform gate length due to the resist pattern 206a's smooth sidewalls. The method 100 may further form gate spacers, doped source/drain regions, contacts for gate/source/drain features, etc. In another embodiment, a target pattern is to be formed as metal lines in a multilayer interconnection structure. For example, the metal lines may be formed in an inter-layer dielectric (ILD) layer of the substrate 202, which has been etched by operation 110 to include a plurality of trenches. The method 100 proceeds to filling the trenches with a conductive material, such as a metal; and polishing the conductive material using a process such as chemical mechanical polishing (CMP) to expose the patterned ILD layer, thereby forming the metal lines in the ILD layer. The above are non-limiting examples of devices/structures that can be made and/or improved using the method 100 and the developer 210 according to various aspects of the present disclosure.

Although not intended to be limiting, one or more embodiments of the present disclosure provide many benefits to a semiconductor device and the formation thereof. For example, a resist developer constructed according to the present disclosure provides low basicity, low molecular penetration, and/or low etching distance. Using such resist developer leads to reduced resist penetration depth randomness, reduced resist pattern swelling, and reduced resist pattern surface roughness such as line edge roughness (LER)

and/or line width roughness (LWR). Such resist developer is advantageous in nanometer semiconductor fabrication where critical dimension (CD) uniformity has become a critical factor in ensuring circuit performance.

In one exemplary aspect, the present disclosure is directed to a method for lithography patterning. The method includes providing a substrate; forming a material layer over the substrate; exposing the material layer to a radiation, resulting in an exposed material layer; and removing a portion of the exposed material layer in a developer, resulting in a patterned material layer. The developer is an alkaline aqueous solution having an organic base that is a quaternary ammonium hydroxide.

In another exemplary aspect, the present disclosure is directed to a method for lithography patterning. The method includes forming a material layer over a substrate; exposing the material layer to a radiation, resulting in an exposed material layer; and removing a portion of the exposed material layer in a developer, resulting in a patterned material layer. The developer is an alkaline aqueous solution having an organic base and the developer has basicity weaker than Tetramethylammonium hydroxide (TMAH).

In another exemplary aspect, the present disclosure is directed to a lithography developing composition. The composition includes an aqueous solvent and an organic base that is represented by the formula:

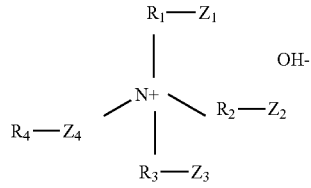

wherein $R_1$—$Z_1$, $R_2$—$Z_2$, $R_3$—$Z_3$, and $R_4$—$Z_4$ are steric functional groups, $Z_1$, $Z_2$, $Z_3$, and $Z_4$ are each a pendant group, and at least one of $R_1$—$Z_1$, $R_2$—$Z_2$, $R_3$—$Z_3$, and $R_4$—$Z_4$ has a van der Waals volume greater than an ethylene group.

In an exemplary aspect, the present disclosure is directed to a lithography developing composition. The composition includes an alkaline aqueous solution having a first organic base and a second organic base, wherein the first organic base is a quaternary ammonium hydroxide with pendant groups on its side chains and the second organic base is another quaternary ammonium hydroxide with electron withdrawing groups on its side chains.

In another exemplary aspect, the present disclosure is directed to a lithography developing composition. The composition includes an alkaline aqueous solution having an organic base that is a quaternary ammonium hydroxide with at least one electron withdrawing group on its side chains and the organic base has basicity weaker than Tetramethylammonium hydroxide (TMAH).

In yet another exemplary aspect, the present disclosure is directed to a lithography developing composition. The composition includes an alkaline aqueous solution having an organic base that is Trimethylphenylammonium hydroxide or Benzyldimethyltetradecylammonium hydroxide.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography developing composition, comprising an alkaline aqueous solution having a first organic base and a second organic base, wherein the first organic base is a quaternary ammonium hydroxide with pendant groups on its side chains and the second organic base is another quaternary ammonium hydroxide with electron withdrawing groups on its side chains.

2. The lithography developing composition of claim 1, wherein the first organic base is represented by the formula:

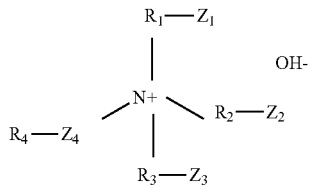

wherein $R_1$—$Z_1$, $R_2$-$Z_2$, $R_3$—$Z_3$, and $R_4$—$Z_4$ are steric functional groups, and $Z_1$, $Z_2$, $Z_3$, and $Z_4$ are each a pendant group.

3. The lithography developing composition of claim 2, wherein $R_1$, $R_2$, $R_3$, or $R_4$ are each selected from the group consisting of an unbranched group, a branched group, a cyclic group, a noncyclic group, a saturated group, an unsaturated group, an alkyl chain, and an aromatic ring.

4. The lithography developing composition of claim 2, wherein at least one of $R_1$, $R_2$, $R_3$, and $R_4$ has a chain with a carbon number ranging from 1 to 15.

5. The lithography developing composition of claim 2, wherein at least one of $R_1$, $R_2$, $R_3$, and $R_4$ has a formula $(R_5O)_nH$ wherein $R_5$ is an alkylene of 1 to 3 carbons and n is an integer ranging from 1 to 20.

6. The lithography developing composition of claim 2, wherein at least one of $R_1$—$Z_1$, $R_2$—$Z_2$, $R_3$—$Z_3$, and $R_4$—$Z_4$ has a van der Waals volume greater than an ethylene group.

7. The lithography developing composition of claim 2, wherein:
$Z_1$, $Z_2$, $Z_3$, and $Z_4$ are each selected from the group consisting of —H, —Cl, —Br, —I, —$NO_2$, —$SO_3$, —CN, —NCO, —OCN, —$CO_2$, —OH, —OR*, —OC(O)CR*, —SR, —$SO_2$N(R*)$_2$, —$SO_2$R*, —SOR, —C(O)R*, —C(O)OR*, —Si(OR*)$_3$, —Si(R*)$_3$, and an epoxyl group; and
R* is selected from at least one of hydrogen, an unbranched group, a branched group, a cyclic group, a noncyclic group, a saturated group, an unsaturated group, an alkyl group, an alkenyl group, and an alkynyl group.

8. The lithography developing composition of claim 1, wherein the second organic base is represented by the formula:

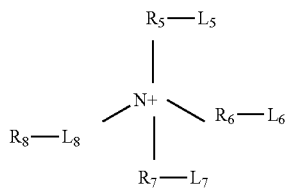

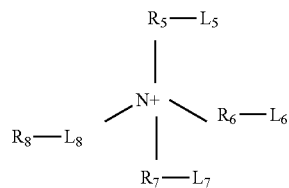

Wherein:
R_5, R_6, R_7, and R_8 are each selected from a group consisting of: a single bond, an unbranched group, a branched group, a cyclic group, a noncyclic group, a saturated group, an unsaturated group, an alkyl chain, and an aromatic ring; and $L_5, L_6, L_7$, and $L_8$ are each an electron withdrawing group and selected from the group consisting of —F, —BF_3, —CF_3, C=O, C=C, CHO, NO_2, —COR, COOR, COOH, CONHR, BR_2, —NHCOR, -phenyl, -pyridine, —SOR, -alkyl, —SO_2F, diketone, naphthalene, diphenyl, and indene.

9. The lithography developing composition of claim 1, wherein at least one of the first organic base and the second organic base is selected from the group consisting of Tetrabutylammonium hydroxide (TBAH) and Tetrapropylammonium hydroxide (TPAH).

10. The lithography developing composition of claim 1, wherein the alkaline aqueous solution is part of a developer, wherein a total concentration of the first organic base and the second organic base range from 0.01% to 2% of the developer.

11. A lithography developing composition comprising:
a developer that is an alkaline aqueous solution having a first organic base and a second organic base, wherein the first organic base is a quaternary ammonium hydroxide with pendant groups on its side chains and the second organic base is another quaternary ammonium hydroxide with electron withdrawing groups on its side chains, wherein the developer has a total concentration of the first organic base and the second organic base ranging from about 0.01% to about 2%.

12. The lithography developing composition of claim 11, wherein the second organic base has basicity weaker than Tetramethylammonium hydroxide (TMAH).

13. The lithography developing composition of claim 11, wherein the second organic base is represented by the formula:

Wherein:
$R_5, R_6, R_7$, and $R_8$ are each selected from a group consisting of: a single bond, an unbranched group, a branched group, a cyclic group, a noncyclic group, a saturated group, an unsaturated group, an alkyl chain, and an aromatic ring; and $L_5, L_6, L_7$, and $L_8$ are each an electron withdrawing group.

14. The lithography developing composition of claim 13, wherein $L_5, L_6, L_7$, and $L_8$ are each selected from the group consisting of —BF_3, —CF_3, C=O, C=C, CHO, NO_2, —COR, COOR, COOH, CONHR, BR_2, —NHCOR, -phenyl, -pyridine, —SOR, -alkyl, —SO_2F, diketone, naphthalene, diphenyl, fluorine, and indene.

15. The lithography developing composition of claim 11, wherein at least one of the first organic base and the second organic base includes Benzyldimethyltetradecylammonium hydroxide.

16. A lithography developing composition comprising:
a first organic base and a second organic base, wherein the first organic base is a quaternary ammonium hydroxide with pendant groups on its side chains and the second organic base is another quaternary ammonium hydroxide with electron withdrawing groups on its side chains.

17. The lithography developing composition of claim 16, wherein a total concentration of the first organic base and the second organic base ranges from about 0.01% to about 2.3%.

18. The lithography developing composition of claim 16, wherein at least one of the first organic base and the second organic base includes Benzyldimethyltetradecylammonium hydroxide.

19. The lithography developing composition of claim 16, wherein the second organic base has basicity weaker than Tetramethylammonium hydroxide (TMAH).

20. The lithography developing composition of claim 16, wherein a pka of the second organic base is less than 9.8.

* * * * *